(12) United States Patent
Crawford

(10) Patent No.: US 10,455,743 B2
(45) Date of Patent: Oct. 22, 2019

(54) COMPUTING EQUIPMENT RACKS WITH VARYING FLUID FLOW RESISTANCE

(71) Applicant: Vapor IO Inc., Austin, TX (US)

(72) Inventor: Colton Malone Crawford, Austin, TX (US)

(73) Assignee: Vapor IO Inc., Austin, TX (US)

( * ) Notice: Subject to any disclaimer, the term of this patent is extended or adjusted under 35 U.S.C. 154(b) by 0 days.

(21) Appl. No.: 15/362,025

(22) Filed: Nov. 28, 2016

(65) Prior Publication Data

US 2017/0079164 A1 Mar. 16, 2017

Related U.S. Application Data

(63) Continuation of application No. 15/065,181, filed on Mar. 9, 2016, now Pat. No. 9,532,488.

(60) Provisional application No. 62/130,018, filed on Mar. 9, 2015, provisional application No. 62/248,788, filed (Continued)

(51) Int. Cl.
  *H05K 7/20* (2006.01)
  *G06F 1/30* (2006.01)
  *H05K 7/14* (2006.01)

(52) U.S. Cl.
  CPC ......... *H05K 7/20736* (2013.01); *G06F 1/305* (2013.01); *H05K 7/1492* (2013.01); *H05K 7/1497* (2013.01); *H05K 7/20145* (2013.01); *H05K 7/20745* (2013.01)

(58) Field of Classification Search
  CPC .......................... H05K 7/20554–2059; H05K 7/20718–20745; H05K 7/20136; H05K 7/20145; H05K 7/00; H05K 7/183; H05K 7/186; G06F 1/20; G06F 1/203;

(Continued)

(56) References Cited

U.S. PATENT DOCUMENTS

| 7,508,663 | B2 * | 3/2009 | Coglitore | ........... H05K 7/20736 165/122 |
| 8,867,204 | B1 | 10/2014 | Gardner | |
| 9,532,488 | B2 * | 12/2016 | Crawford | ........... H05K 7/20736 |

(Continued)

FOREIGN PATENT DOCUMENTS

CN 101211206 A 7/2008

OTHER PUBLICATIONS

Office Action for Related Chinese Application 201680014748.4 No. dated Sep. 29, 2018, pp. 1 to 11, including English Abstract.

(Continued)

*Primary Examiner* — Zachary Pape
(74) *Attorney, Agent, or Firm* — Pillsbury Winthrop Shaw Pittman LLP

(57) ABSTRACT

Provided is a datacenter chamber having racks configured to hold arrays of rack-mounted computing devices. The datacenter chamber comprises three or more racks, each rack having a plurality of receptacles configured to hold a computing device; a chassis configured to secure each of the racks in spaced relation relative to one another, wherein the chassis is configured to secure the racks facing outward from an interior chamber defined by a back-side of the racks, and wherein the chassis is configured to position the racks facing at least three different directions; and an integrated cooling system configured to drive a cooling fluid along computing devices mounted in the racks and through the interior chamber.

22 Claims, 14 Drawing Sheets

Related U.S. Application Data on Oct. 30, 2015, provisional application No. 62/275,909, filed on Jan. 7, 2016.

(58) Field of Classification Search
CPC ........ H04Q 1/02; H04Q 1/06; H04Q 2201/02; A47B 2097/006
See application file for complete search history.

(56) References Cited

U.S. PATENT DOCUMENTS

| | | |
|---|---|---|
| 2007/0064383 A1* | 3/2007 | Tanaka ................... G06F 1/181 361/679.33 |
| 2009/0251860 A1 | 10/2009 | Belady et al. |
| 2012/0103843 A1 | 5/2012 | Wei |
| 2013/0120931 A1 | 5/2013 | Sankar et al. |
| 2013/0233532 A1* | 9/2013 | Imwalle ................. F28F 27/02 165/287 |
| 2014/0177163 A1 | 6/2014 | Wiley |
| 2014/0185225 A1 | 7/2014 | Wineland |
| 2016/0107312 A1* | 4/2016 | Morrill .................. B25J 9/1664 29/402.08 |

OTHER PUBLICATIONS

Search Report for Related European Application No. 16762406.3 dated Sep. 10, 2018, pp. 1 to 7.
Examination Report for Related Australian Patent Application 2016229829, dated Jul. 31, 2019, pp. 1 to 3.

* cited by examiner

COMPUTING EQUIPMENT RACKS WITH VARYING FLUID FLOW RESISTANCE

CROSS-REFERENCE TO RELATED APPLICATIONS

The present application is a continuation of U.S. patent application Ser. No. 15/065,181, filed 9 Mar. 2016, which claims the benefit of the following U.S. Provisional Patent Applications: U.S. 62/130,018, filed 9 Mar. 2015; U.S. 62/248,788, filed 30 Oct. 2015; and U.S. 62/275,909, filed 7 Jan. 2016. The entire content of each parent application is incorporated by reference in its entirety.

BACKGROUND

1. Field

The present invention relates generally to computing equipment and, more specifically to racks for computing equipment.

2. Description of the Related Art

Computer racks, such as server racks, are generally used to house and in some cases interconnect collections of computing devices, like servers and associated storage, power supplies, network switches, and the like. In many cases, the computing devices are relatively numerous and arranged in a relatively high-density array due to the cost of space appropriate to store such computing devices and the desire to reduce latency by having the devices close to one another. Often the computing devices generate a relatively large amount of heat during operation, and cooling the computing devices can be energy intensive. Indeed, in many cases, cooling costs account for a substantial portion of the cost of running such devices. Such devices also present other challenges relating to reliability, installation, component costs, and the like, each of which can add to the cost of providing computing services, e.g., in a datacenter having a relatively large number of such computer racks.

SUMMARY

The following is a non-exhaustive listing of some aspects of the present techniques. These and other aspects are described in the following disclosure.

Some aspects include a datacenter chamber having racks configured to hold arrays of rack-mounted computing devices. The datacenter rack comprises three or more racks, each rack having a plurality of receptacles configured to hold a computing device; a chassis configured to secure each of the racks in spaced relation relative to one another, wherein the chassis is configured to secure the racks facing outward from an interior chamber defined by a back-side of the racks, and wherein the chassis is configured to position the racks facing at least three different directions; and an integrated cooling system configured to drive a cooling fluid along computing devices mounted in the racks and through the interior chamber.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
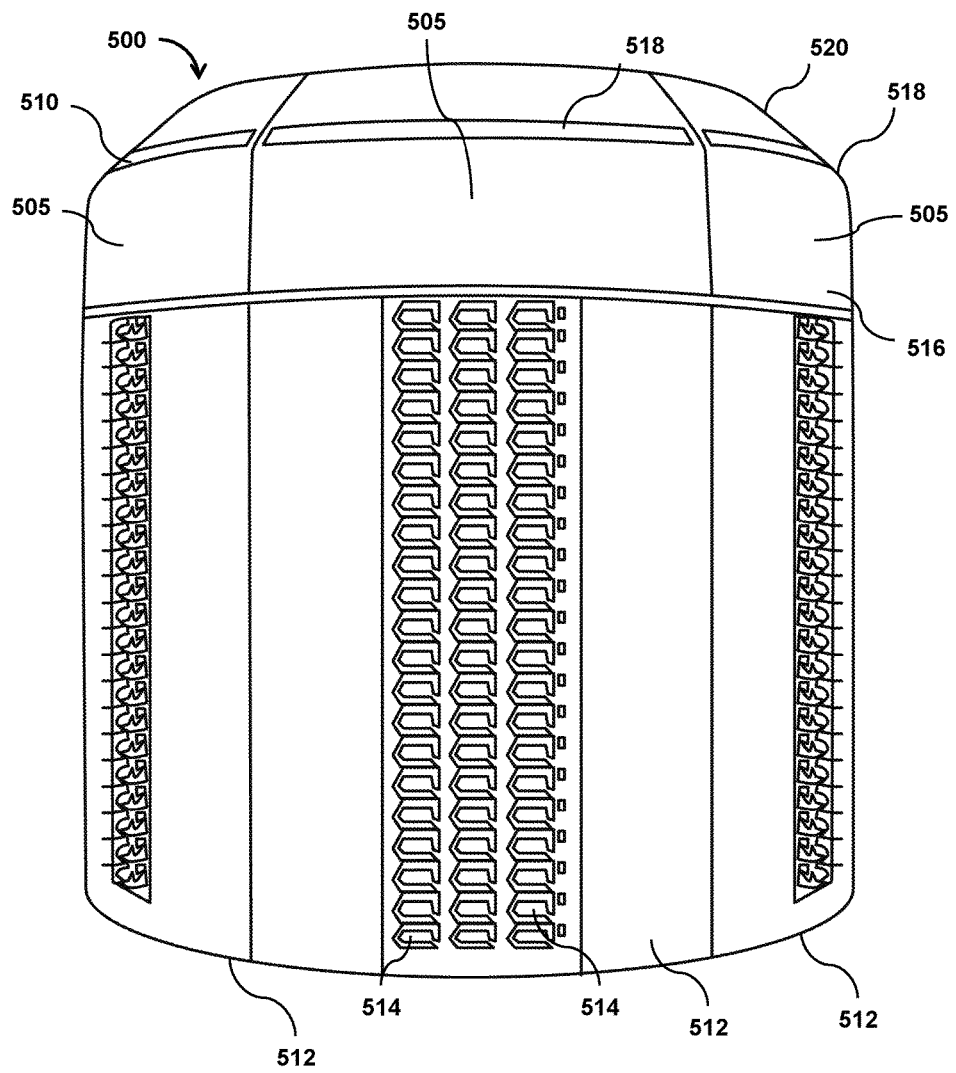
FIG. 1 illustrates an example of a cylindrical datacenter chamber, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Figure 3:
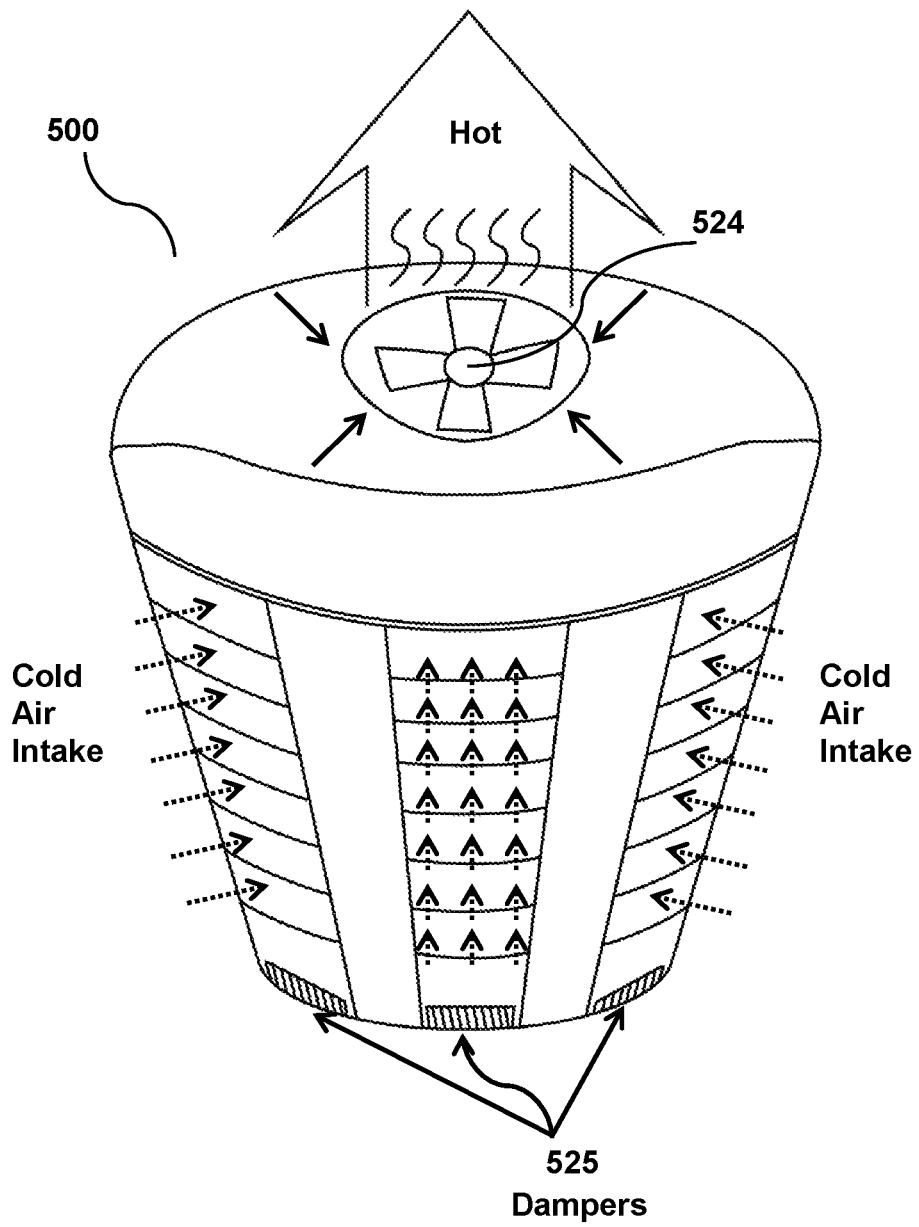
FIGS. 3-4 illustrate operation of the cylindrical datacenter chamber of FIG. 1, in accordance with some embodiments.
Figure 4:
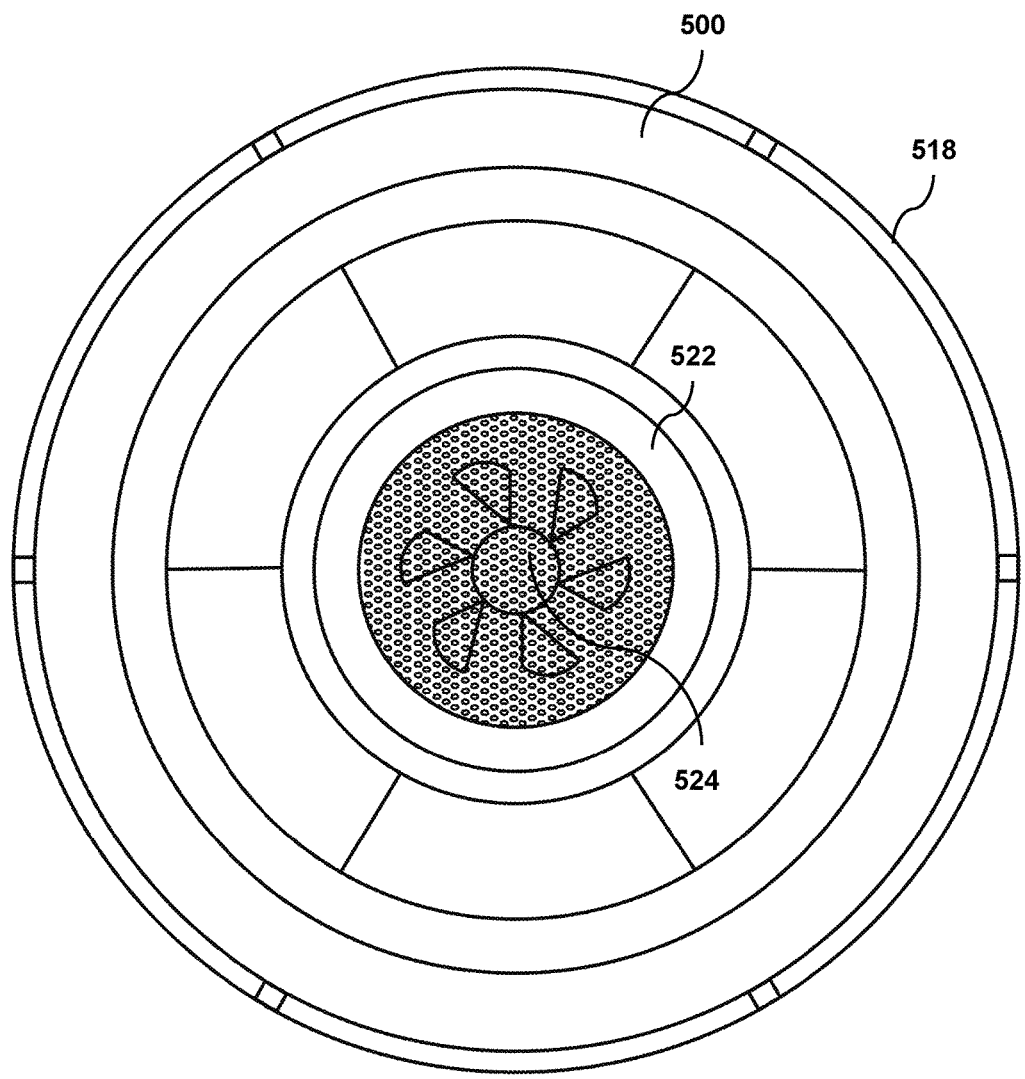

FIG. 1 depicts an embodiment of a datacenter chamber 500 in accordance with the present techniques. In some embodiments, datacenter 500 includes a collection of adjacent racks arrayed non-linearly (e.g., in a circle, oval, square, etc.) so as to at least partially define an interior chamber (e.g., by fully enclosing the interior chamber in a horizontal plane, or by partially enclosing the interior chamber, like by defining a concave area in the plane). The interior chamber defines a compartment through which cooling fluid flows, in some cases having a substantially an empty space through which cooling fluid like air may flow. Some embodiments may provide for a generally cylindrical datacenter chamber 500, having a plurality of wedge racks, each with a stack of vertically arrayed, outward facing servers. Wedge-shaped racks generally have an outer portion (further from the interior chamber) that is wider than an inner portion (adjacent the interior chamber). This arrangement is expected to allow for relatively easy access to equipment on the wedge racks (e.g., for maintenance, cabling, installation, etc.) An integrated cooling or ventilation system may be provided by which air is drawn or pushed through the inner chamber (e.g., via fans near the top or bottom of the inner chamber as shown in FIGS. 3-4 and described below). Additionally or alternatively, in some embodiments, ducting may be coupled to the column, the data center pressurized, and air may flow through the ducting to a region at a lower pressure (or the ducting may be driven to a lower pressure than a data center at ambient air pressure). Finally, arranging can be challenging due to the weight of the racks, particularly when the body of the racks serves to constrain and direct airflow, often leading to relatively narrow tolerances for mating between adjacent racks. Some embodiments may include a guiding and seating system for aligning the racks during assembly, as described below.

In some cases, the chamber may form a relatively self-contained unit, having cooling infrastructure independent of building-provided heating, ventilation, and air conditioning (HVAC). In some cases, the chamber may also have power conditioning circuitry (e.g., rectifiers, low-pass filters, and surge-protectors) and back-up power supplies (e.g., batteries). In some embodiments, each chamber includes an integrated, self-contained compute fabric by which computing devices are interconnected. A relatively self-contained chamber 500 as described above may provide benefits such as easy shipping, easy access to components within the chamber, cost effective heat and humidity control, and independency from other infrastructure (e.g., datacenter building, other datacenter units, etc.). That said, several independently useful inventions are described, so not all embodiments provide all of these benefits.

FIG. 1 shows an example of a chamber 500 including a plurality of racks 505 configured to hold arrays of rack-mounted computing devices 514. Racks 505 are arranged non-linearly (e.g., in a rotationally symmetric array) to define chamber 500 and the interior chamber (shown in later views). Racks 505, in some embodiments, are "wedge racks" shaped to define the interior chamber when placed adjacent one another, for instance, by forming a wedge-shape in their horizontal cross section. In some embodiments, wedge racks 505 may be arranged into a shape such as a triangle, square, hexagon, or octagon with the back sides all facing towards (and in some cases partially or entirely defining) the interior chamber. In some embodiments, the chamber 500 may have a generally cylindrical shape, e.g., a circular cylindrical shape. In some embodiments, the chamber 500 may be generally rotationally symmetric about a vertical axis extending through the center of the chamber 500. In some embodiments, the interior chamber of datacenter chamber 500 (shown in FIGS. 3 and 4) may generally be of cylindrical shape. In some cases, the interior chamber of datacenter chamber 500 may define (e.g., approximate) a right cylinder with a base having a variety of shapes consistent with the present techniques, e.g., a rectangular, triangular, pentagonal, hexagonal, heptagonal, octagonal, decagonal, dodecagonal, or elliptical. In some cases, the interior chamber may define a tapered shape, such as an inverted cone, in which the diameter of the bottom is larger than the top or vice versa.

In some embodiments, chamber 500 provides front side rack access (the outer perimeter of the chamber) to access three categories of information technology interfaces (e.g., of computing devices 514): compute; network, and storage. In some embodiments, the components by which the computing devices are connected to power and one another may be accessible from the exterior of the chamber, e.g., the inner column may be generally or fully devoid of such connections, or alternate connections may be accessible from the exterior. (Or some embodiments may include such connections in the interior.)

Figure 11:
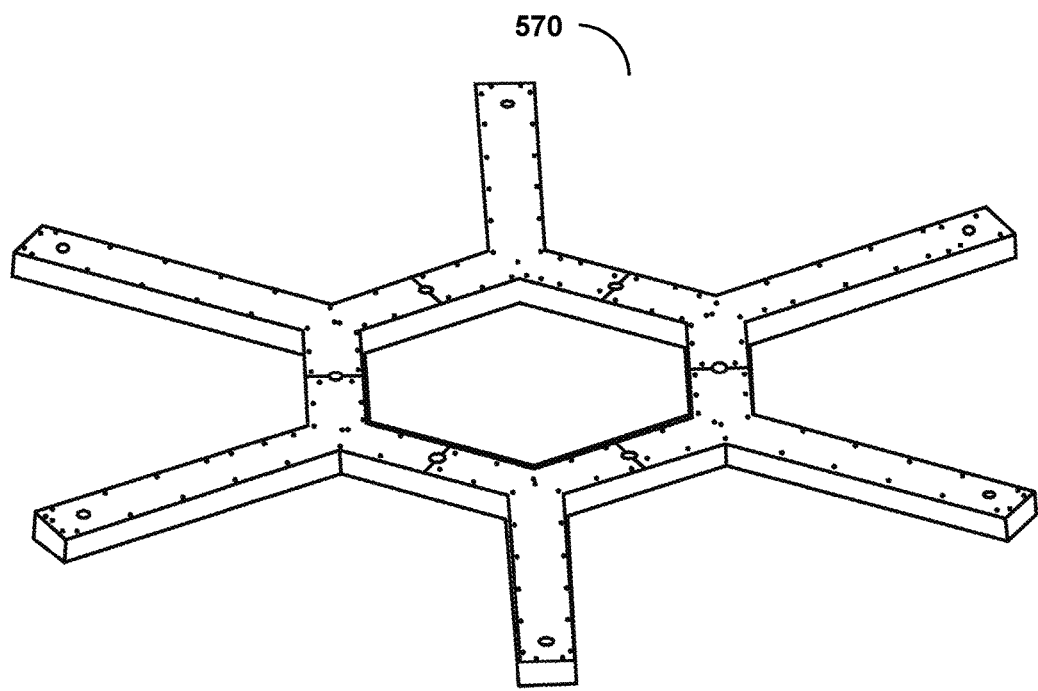
FIG. 11 illustrates a leveling base for the wedge racks of the cylindrical datacenter chamber of FIG. 1, in accordance with some embodiments.

In some embodiments, a lid 510 is configured to fit on top of the wedge racks. Lid may include an upper portion 518 and a lower portion 516 (on the opposite side of the upper portion vertically) and an illumination strip 518, behind which may reside an array of light emitting diodes connected to a rack controller. Light color, intensity, and flashing rates or patterns may indicate status of computing devices in the rack. Lid 510 may define an empty chamber space located between lower portion 516 (where lid 510 and the wedge racks connect) and upper portion 518 of lid 510. The empty space may be house wiring and a top-of-rack network switch in some embodiments. In some cases, chamber 500 may include a leveling base 512 described with reference to FIGS. 11-13.

In some cases, the number of wedge racks 505 is at least three racks, e.g., five racks or six racks, or more. In some embodiments, each wedge rack 505 may be substantially identical to the other wedge racks, and each receptacle, called a "U" in each rack may be substantially identical to the others. In some embodiments, when assembled, the orientation of the wedge racks may differ by an amount less than 180 degrees, e.g., less than 90 degrees. In some embodiments, as described below, each wedge rack may be engineered with a holistic embedded systems engineering methodology to allow the rack to function as a "device"/ "appliance", and not as a traditional rack/row architecture, which is expected to be particularly advantageous in web-scale applications. In some embodiments, chamber 500 may eliminate traditional "U's" of measurement by integrating the "pitch" into the chamber itself. That said, embodiments are not limited to systems that provide these benefits, as various independently useful techniques are described here, which is not to suggest that any other feature may not be omitted in some cases.

In some cases, the datacenter chamber 500 may house more than 50 U's of computing devices 514 and may span more than 5 feet in diameter (e.g., approximately 9 feet). Further, in some cases, the racks in the chamber may be approximately the height of a person, e.g., on the order of six feet tall to facilitate access by technicians (e.g., five feet or higher). In some embodiments, one or more datacenter chambers may be part of a modular data center that can be placed where data capacity is needed. This may allow for rapid deployment, energy efficiency, high-density computing, and cost reduction (though embodiments are also consistent with a non-modular design).

Figure 2:
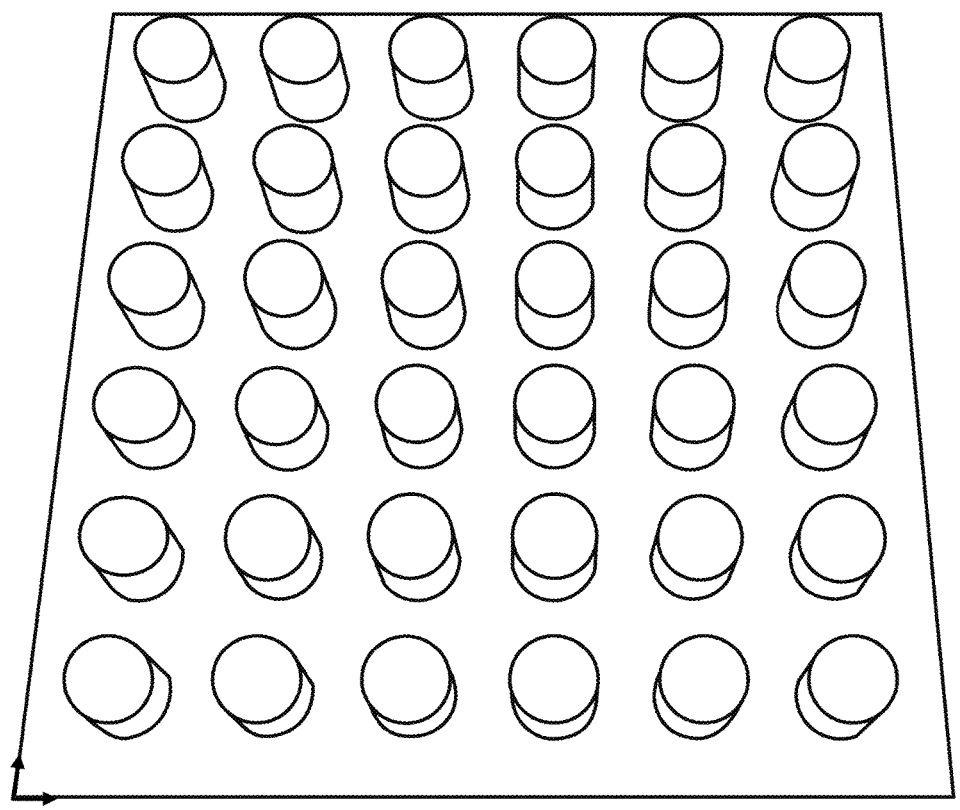
FIG. 2 illustrates a datacenter having an array of cylindrical datacenter chambers of FIG. 1, in accordance with some embodiments.

In some embodiments, a plurality of datacenter chamber 500 may be may be arranged in a datacenter. FIG. 2 illustrates an example of a datacenter having an array of cylindrical datacenter chambers. In some embodiments, the chambers may be arranged in a square or a hexagonal lattice, or other arrangements. In some cases, one or more datacenter chambers 500 may be added to existing data centers with or without similar characteristics (e.g., having different server rack units). In some embodiments, one or more datacenter chambers 500 may be containerized for easy transportation. For example, datacenter chambers 500 (with or without datacenter equipment) may be configured to fit into a standard shipping container, which is then transported to a desired location. Datacenter chamber 500 may be advantageous for use in portable data center environments at least because it of its integrated cooling or ventilation system capacity as will be discussed below.

Controlling air temperature and humidity in the chamber (and in a datacenter in general) is expected to help protect equipment from malfunction and damage. In some cases it may also reduce power consumption and cost. For example, temperatures in a datacenter chamber 500 may rise because of the amount of power used in the datacenter chamber which may cause heat damage to equipment on the wedge racks. High humidity may cause water to condense on internal components within the datacenter chamber. Low humidity may cause static electricity discharge problems which may damage components within the datacenter chamber. A variety of arrangements may direct air to flow circumferentially inward or outward to cool rack-mounted computing equipment. In the illustrated embodiment, wedge racks 505 of chamber 500 (FIG. 1) are arranged into a cylindrical shape (or they may be arranged in other shapes described above such as a square, hexagon, or octagon with the back sides all facing towards the center). This, in some cases, allows outside cold air to be pulled (or pushed) in from several (e.g., all horizontal) directions to cool equipment in chamber 500. The cold (e.g., relative to the computing equipment) air may flow over the computing devices, drawing heat therefrom, and into the interior cylinder. From the cylinder, the air may be exhausted through a fan that drives the airflow as shown by the arrows in FIG. 3.

The incoming air is heated as it passes across heatsinks (pulling waste heat from computing equipment) and other warm components inside the equipment, in these embodiments. In some embodiments, the hot air exits the backs of the wedge racks and enters the inner chamber and exits through the top of the chamber. FIGS. 3-4 illustrate operation of the chamber of FIG. 1, in accordance with some embodiments. Cold air may be pulled or pushed from all directions of chamber 500, drawn to the inner chamber and exits through an exhaust output 522 in the top of chamber 500. (Or the flow may be reversed.) In some embodiments, a lid (e.g., lid 510 of FIG. 10) configured to cover the top of the chamber serves as a barrier that prevents the hot air from mixing back in with the cold air. In some embodiments, a fan 524 in FIGS. 3-4, or an array of fans may be arranged and positioned in the top of the lid and configured to pull the hot air upward. In some cases, the fan may be configured to pull the hot air into ductwork that routes the air elsewhere.

Figure 5:
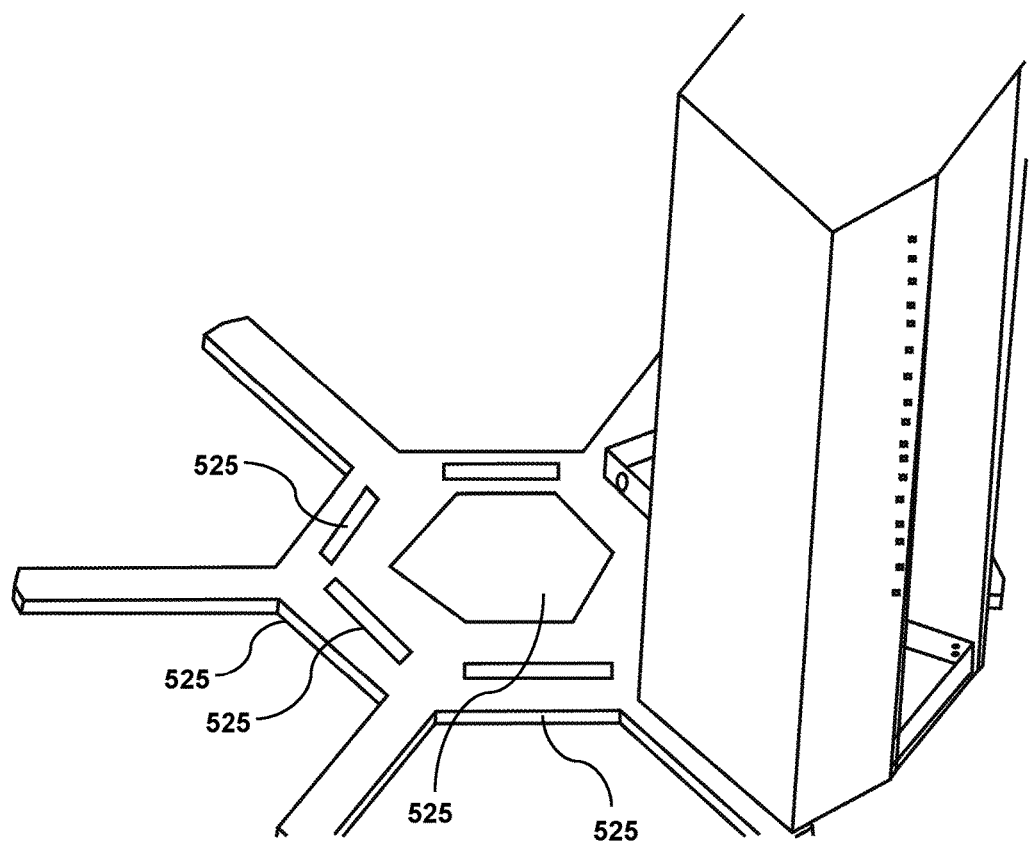
FIG. 5 illustrates examples of components of the cylindrical datacenter chamber of FIG. 1, in accordance with some embodiments.

In some embodiments, chamber 500 may include dampers configured to adjust the flow of air. FIG. 5 illustrates an example of dampers 525. In some cases, dampers 525 in FIGS. 3 and 5, located at the base of the chamber may be used to adjust the flow of air. In some embodiments, the dampers may include one or more valves, or plates configured to control, stop, or regulate the flow of air inside chamber 500. In some embodiments, one or more dampers may be manual (e.g., using a manual handle to control the damper), or automatic (e.g., using motors that are controlled by a thermostat). Industry recommended temperatures generally range between 64 and 81° F., a dew point range between 41 and 59° F., and a maximum relative humidity of 60. In some embodiments, temperatures may range between 59 and 90° F.

In some embodiments, chamber 500 may include an integrated cooling system configured for directing air to flow circumferentially inward or outward to cool rack-mounted computing equipment, for instance, by driving a cooling fluid along computing devices mounted in the wedge racks of chamber 500 and through the interior chamber of chamber 500. The present techniques are described with reference to a cooling gas (air), but are consistent with other fluids, e.g., in systems immersed in mineral oil. In some embodiments, the integrated cooling system of chamber 500 is independent from other cooling systems (e.g., for other chambers in the datacenter, for the room where the datacenter is located, or for the building where the datacenter is located). In some cases, the integrated cooling system of chamber 500 may be controlled in concert with other cooling systems for other chambers, for the room or for the building. Cooling systems, humidifiers, ventilators, or other temperature and humidity control systems may be used to help control air temperature and humidity. In some embodiments, the integrated cooling system of chamber 500 may be configured to provide cooling and humidity control by directly drawing fresh air into the cooling system (e.g., through a vent, duct, etc.) In some embodiments, the integrated cooling system may be a portable cooling system. In other cases, the integrated cooling system maybe an integral part of chamber 500 (e.g., part of the chassis described below).

The integrated cooling system of chamber 500 may use one or more different techniques for forcing air to flow over computing equipment mounted in the wedge-shaped racks. For example, the cooling system may drive a cooling fluid (e.g., air, gas, water, chemicals, or other cooling fluids) along equipment in chamber 500 and through the interior chamber with a pump, like a centrifugal pump, in the case of liquids, or a fan, in the case of gasses. The cool fluid is heated as it passes through equipment and is driven out of the chamber. For example in case of air or other gasses, the heated fluid may be driven out by a fan located near an end of the interior chamber e.g., top (or located elsewhere within, or near to chamber 500) to a duct or a vent. Or in the case of cooling liquids, the heated liquid may be directed out of the chamber and into a heat exchanger using a pump.

For instance, in some embodiments, chamber 500 may include an integrated ventilation infrastructure. In some embodiments, the integrated ventilation infrastructure of chamber 500 is independent of other ventilation systems of other chambers, room, or building. In some cases, the integrated ventilation infrastructure may be controlled in concert with ventilation of other chambers in the datacenter, ventilation of the room, or building. In some embodiments, the ventilation infrastructure may include one or more fans in series or parallel. In some embodiments, the integrated ventilation infrastructure includes a plurality of motors attached to a fan through controlled clutches.

Figure 6:
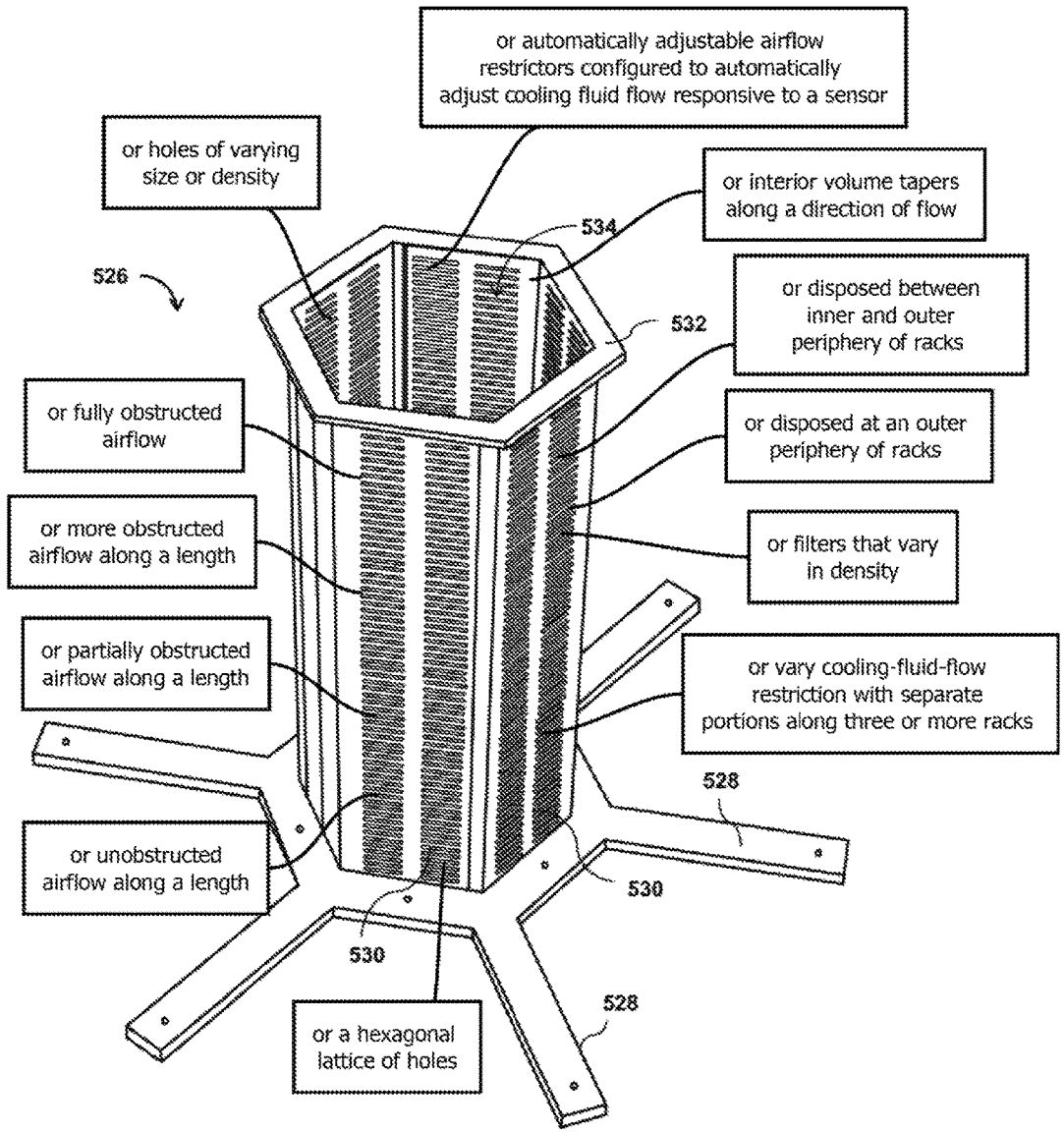
FIG. 6 illustrates a chassis of the cylindrical datacenter chamber of FIG. 1, in accordance with some embodiments.

FIG. 6 illustrates a chassis of the datacenter chamber 500 of FIG. 1, in accordance with some embodiments. Chassis 526 may be configured to secure one or more racks in spaced relation relative to one another. Chassis 526 may be configured to position the racks facing at least three different directions, e.g., six directions in the illustrated example. Wedge rack 536 (FIG. 7) is secured to chassis 526 such that chamber 536 is facing outward from the interior chamber defined by the back side of chamber 536 and the back side of other racks when secured to chassis 526. This may eliminate the need to reach the back side of the chamber (for maintenance, computing, networking, etc.), as opposed to existing rack cabinets which necessitate access to the back of the rack cabinets for operating some functions of the equipment, servicing, or securing the equipment. Existing rack cabinets are usually placed in single rows forming aisles between them to allow access to the back of the rack cabinets.

In some embodiments, chassis 526 includes a chamber brace 532 configured to connect to a leveling base 528 of chassis 526. Brace 532 is a multi-surface brace. Each surface is configured to receive a wedge rack. In some embodiments, brace 532 may be configured to fit within leveling base 528. In some cases brace 532 may be configured to fit on top of leveling base 528. In some embodiments, brace 532 and leveling base 528 may be configured to be removably connected (screws for example). In some embodiments, brace 532 and leveling base 528 may be permanently connected (e.g., welded, or permanently glued together).

In some embodiments, chassis 526 may include baffles 530/534 configured for directing air for an efficient air flow within chamber 500 (e.g., for cooling, ventilation, heat exchange, etc.) In some cases, the baffles may make airflow more uniform into or out of the chamber. Different rack-mounted computing devices may obstruct air differently, potentially leading to areas of high flow and other areas of low flow. The low flow areas may not be adequately cooled. To mitigate this issue, the baffles may constrain airflow and, thereby, account for a substantial portion of the pressure drop between the interior and exterior of the chamber. As a result, it is expected that computing-device specific differences in the pressure drop will account for a smaller portion of the total pressure drop, thereby evening fluid flow. In some embodiments, the baffles may be in the form of vanes, panels, orifices, or other forms. In some embodiments, the baffles may be one or more of longitudinal, horizontal, or other type of baffles.

In some embodiments, baffles 530/534 may include baffles configured to vary airflow restriction vertically along the length of the interior chamber to reduce the likelihood of positive pressure developing in the downstream end of the interior chamber. Positive pressure on what is intended to be the downstream side of the rack, in some use cases, is undesirable, as it can cause hot air to flow back from the interior chamber towards some of the racks, heating rather than cooling computing equipment. For instance, from the bottom of the interior chamber to the top of the interior chamber, the amount of airflow restriction provided may progressively increase, e.g., from an unobstructed region along one quarter of the length, to a partially obstructed region spanning the next quarter of the length, to an even more obstructed region spanning the next quarter of the length, and finally to a fully obstructed portion for the final quarter. A variety of structures may be used to partially obstruct airflow. Examples include arrays of holes drilled in a plate (like in a hexagonal lattice), with hole size and density decreasing as airflow obstruction increases. In some embodiments, airflow restriction may vary smoothly from one end of the chamber to the other, or separate portions may be defined. In some embodiments a filter media of increasing density may vary the resistance to airflow. In some embodiments the varying impediments to flow may be placed at the outer radius of the chamber or intermediate between the inner chamber and outer surface.

Figure 7:
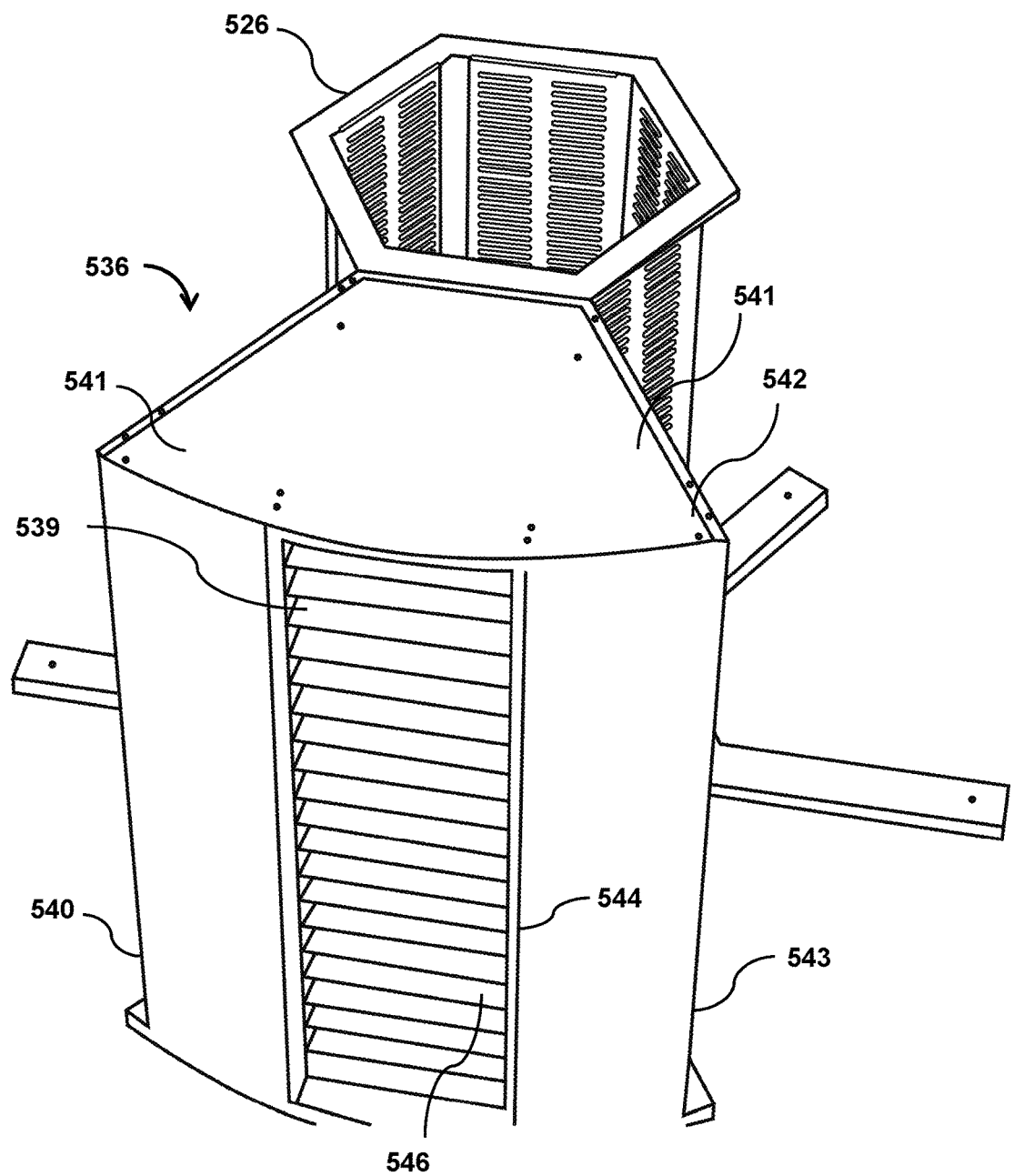
FIG. 7 illustrates a wedge rack of the cylindrical datacenter chamber of FIG. 1, in accordance with some embodiments.

FIG. 7 illustrates an example of a wedge rack 536 positioned on chassis 526. In this example, wedge rack 536 defines a generally wedge-shaped volume 541 along at least one side of the wedge rack. In some embodiments, the wedge rack comprises three articulating panels. A first panel 539 (not shown, but the element number identifies the area covered by the panel) may be configured to selectively provide access to a rack of computing devices 544, a second panel 540 configured to selectively provide access to a first wedge-shaped volume on one side of the rack of computing devices 544, and a third panel 543 configured to selectively provide access to a second wedge-shaped volume on a second side of the rack of computing devices. In some embodiments, computing devices may be disposed on equipment selves 546. First panel 539 may provide front-side access (front side being the opposite side of a back side adjacent to the interior chamber) for compute, network, and storage interfaces for computing devices mounted in the racks. Wedge rack 536 may include wedge rack top cover 542 configured to fit on top of wedge 536. In some embodiments, top cover 542 may be removably connected to the top of wedge 536. In some cases, wedge 536 may be permanently connected to the top of wedge 536.

Figure 8:
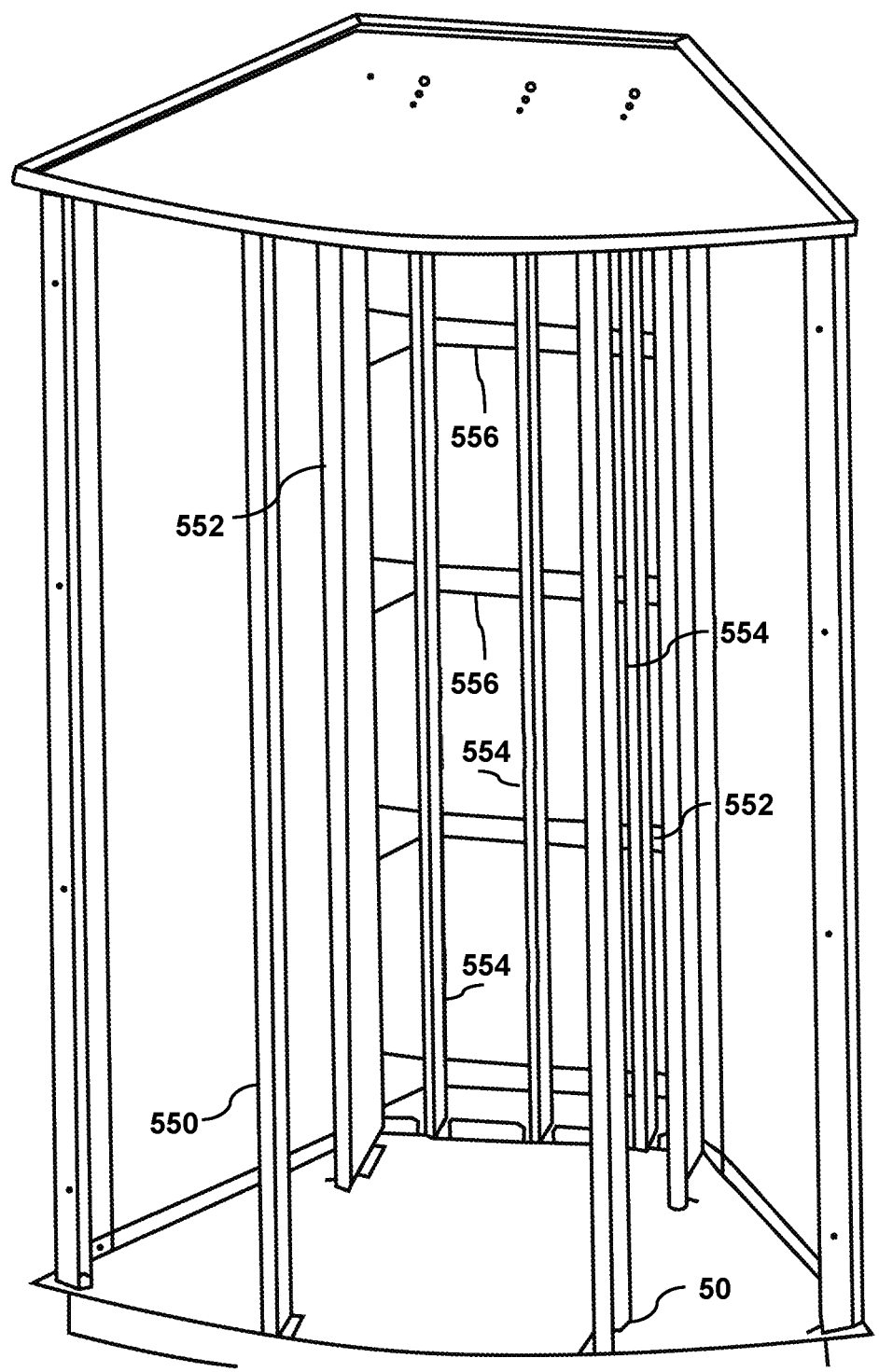
FIGS. 8-10 illustrate examples of components of the wedge rack of the cylindrical datacenter chamber of FIG. 1, in accordance with some embodiments.
Figure 9:
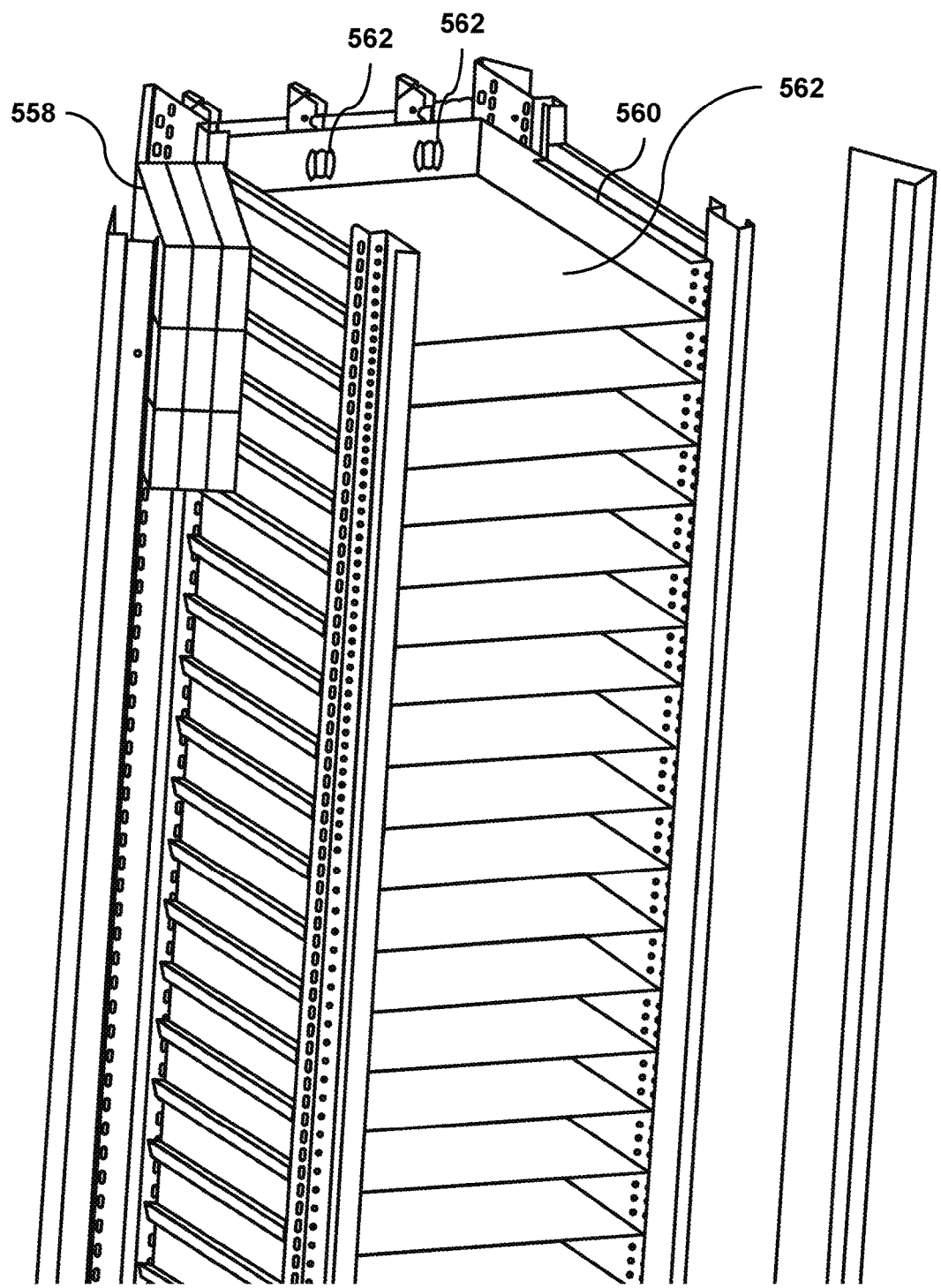
Figure 10:
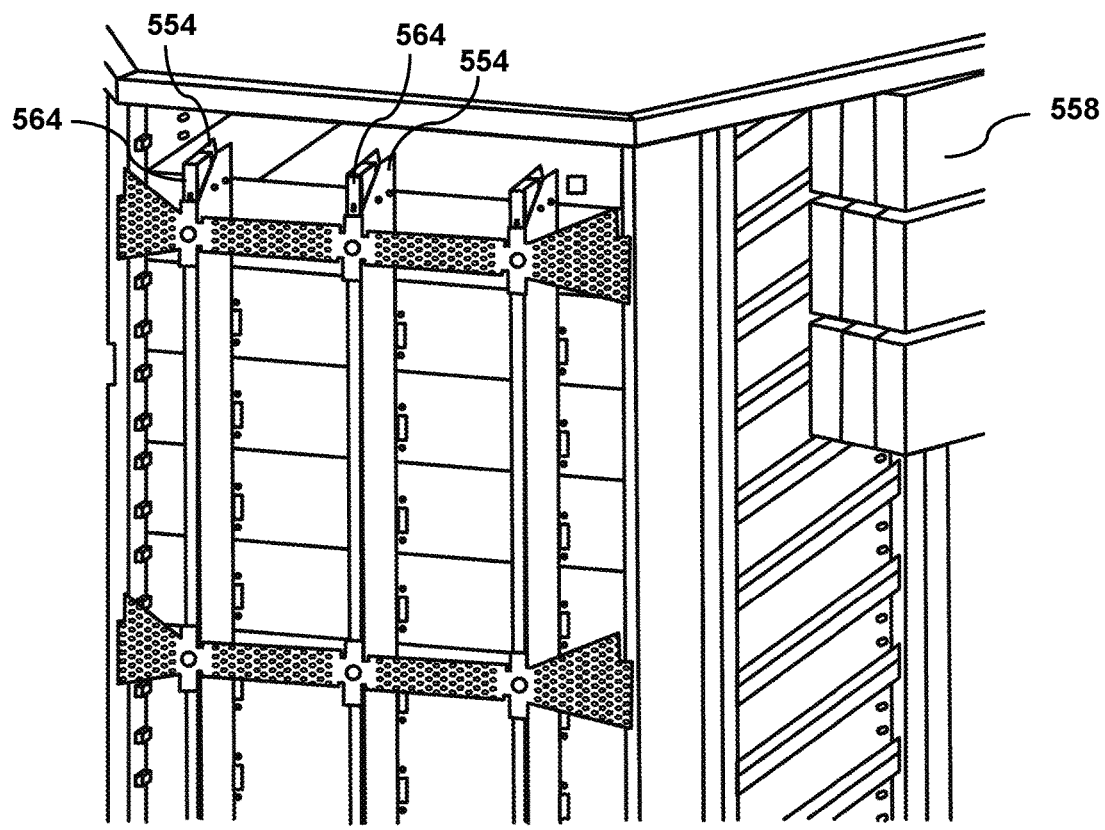

FIGS. 8-10 illustrate examples of components of a wedge rack, in accordance with some embodiments. In some embodiments, wedge rack 536 includes a plurality of structural support elements configured to provide structural support and allow for heavy equipment mounting. For example, FIG. 8 shows rack front supports 550 located proximate an outer face of the wedge rack and extending vertically, rack rear support 552 located proximate to a back side of the wedge rack and extending vertically, and bus bar braces 556 extending horizontally and located proximate to a back side of the wedge rack adjacent the interior chamber coupled approximately perpendicular to rack rear support 552 and rack front support 550. A plurality of bus bars 554 may be disposed along the racks adjacent the interior chamber. Bus bar 556 may be connected to bus braces 556 (e.g., via screws).

The bus bars may be configured to distribute direct current (DC) power to at least some of the computing equipment by conducting electricity (e.g., direct current) within the racks, e.g., delivering power to rack mounted computing devices that establish electrical contact with the bus bars upon being slid into the rack. The bus bars may be in the form of a metallic strip or bar (e.g., copper, brass or aluminum), and the bus bars may be electrically isolated from the chamber chassis. In some embodiments, the bus bars may be of other shapes (e.g., flat strips, solid bars and rods, solid or hollow tubes, and braided wire). Some of these shapes allow heat to dissipate more efficiently due to their high surface area to cross-sectional area ratio. Hollow or flat shapes are prevalent in higher current applications. In some cases, the one or more bus bars may be enclosed in a bus duct. The material composition and cross-sectional size of the bus bar may determine the maximum amount of current that can be safely carried. In some embodiments, the bus bars may have insulators 564, or insulation may surround them in some cases to protect them from accidental contact. In some cases bus bars may be enclosed in a metal housing, in the form of bus duct or busway, segregated-phase bus, or isolated-phase bus.

In some embodiments, chamber 500 may include a plurality of direct current (DC) bus bars for power distribution. Generally, rack-mounted computing equipment consumes DC power. Traditionally, in many cases each instance of equipment received alternative current (AC) power and converted the AC power to DC power with a dedicated power converter. This technique however can be expensive and generate additional heat near the computing equipment. Some embodiment may eliminate the need for the AC power converters by providing DC power. Or in some cases it can be expensive to power an AC voltage input power supply from the DC bus bar. In some embodiments, a bus bar power adapter may allow traditional AC voltage servers to be safely powered, and in some cases, controlled or monitored, via a DC power source.

In some embodiments, datacenter chamber 500 may include a backup power supply. In some cases, chamber 500 may include an integrated power infrastructure. For example, an uninterruptible power supply (UPS) which may be configured to provide uninterrupted power over some duration. In some embodiments, the power supply may be a battery-driven power supply (As shown in FIGS. 9-10 wedge rack 536 may include a rectifier or a battery module 558). For example, a higher-voltage direct current (DC) power source, such as a battery may provide electrical power that is converted into a lower voltage, higher current DC power source. In some embodiments, the battery may be based on any of a variety of different chemistries. Examples include lead-acid, nickel-metal hydride, lithium ion, and the like. In some embodiments, other power sources may be used, such as fuel cells, banks of capacitors, and the like. The transformation may be effected by a DC-DC converter, such as a 48-volt to 12-volt DC-DC converter that receives 48 volt DC power at given current and produces 12-volt DC power at a substantially higher current. In some embodiments, the several of the above UPSs may be placed in each rack. In some embodiments, each wedge of a rack may include a separate UPS, e.g., three or more UPSs for each wedge connected in parallel to increase current at a given voltage over that provided by a single UPS. Modular power supplies are expected to limit the scope of damage if any one UPS fails. In some embodiments, the UPS may be controlled remotely.

In some embodiments, datacenter chamber 500 includes a plurality of computing devices disposed in the racks. The computing devices may be disposed on equipment trays 560. In some cases trays 560 may have a plurality of openings on the back of the trays adjacent the inner chamber. The opening may be configured to facilitate connection of the equipment and bus bars. In some embodiments, the openings may include bus bar connectors (example 562 in FIG. 9). The computing devices may have stored thereon operating systems and user-applications (e.g., server applications, databases, load balancers, etc.)

In some embodiments, datacenter chamber 500 may include an integrated compute fabric configured to connect a plurality of computing devices within the chamber. The integrated compute fabric may be configured to connect the computing devices through interconnected nodes and links that look like a "fabric". The nodes may refer to processors, memory, or peripherals and the links may refer to functional connection between nodes. The integrated compute fabric may allow for high processing capabilities.

With some traditional systems, installations are difficult when racks are required to be positioned in relatively precise orientations in order to create a particular geometric shape or to direct airflow. To mitigate this issue, some embodiments use a modular and interlocking leveling base 570 (FIGS. 11-13) framework that serves to both level and to orient the racks into alignment, thus enabling the assembly of complex arrangements of racks with ease. That said, embodiments are not limited to systems that provide these benefits, as various independently useful techniques are described here, which is not to suggest that any other feature may not be omitted in some cases.

Figure 12:
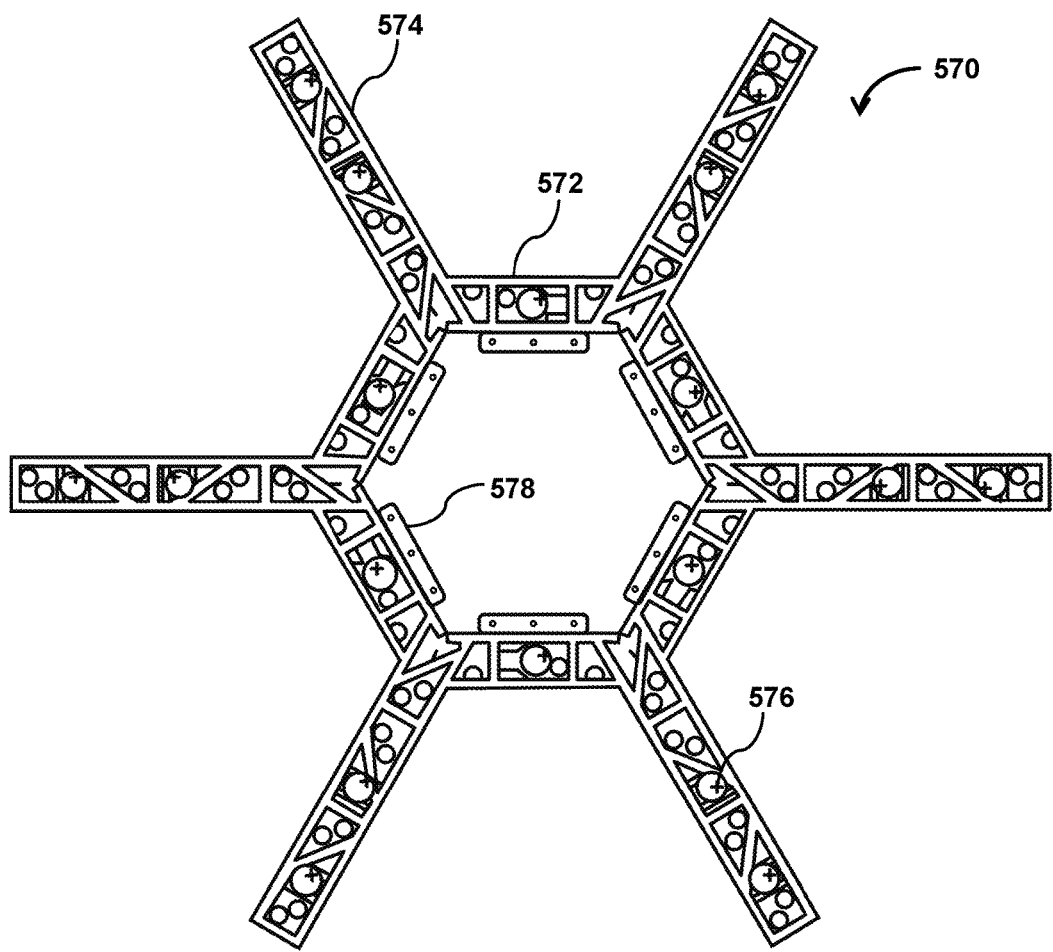
FIG. 12 is a bottom view of the leveling base of FIG. 11, in accordance with some embodiments.

In some embodiments, leveling base 570 includes a center piece 572 and a plurality of horizontally extending arms 574. Center piece 572 may be of hexagonal shape. Or in other cases, the leveling base may of triangular, square, pentagonal, hexagonal, heptagonal, octagonal, decagonal, dodecagonal, or other shapes. In some embodiments the leveling base is of the same shape as the base of chassis (described above). In some embodiments, the leveling base includes a plurality of modular sections configured to be connected together to form the leveling base (e.g., screws, rivets, etc.) This may help in shipping, installation and configuration of the leveling base. In some embodiments, the modular sections may be assembled on-site and then leveled to ensure even weight distribution across the floor. In some embodiments, leveling base 570 may be constructed of aluminum, steel, or a combination thereof to help keep the weight down. The leveling base may be bolted to the floor, using a plurality of bolting plates 578 (as shown in FIG. 12) located in the bottom side of the leveling base, to secure the structure in place to allow for installation and alignment of the racks. The bolting plates may be arranged such that they extend away from the leveling base towards the inner center section of the base.

In some embodiments, the bottom side of the leveling base includes a plurality of adjustable leveling feet 576 configured to level the base and, later when installed, the rest of the chamber. The adjustable leveling feet may be configured to be threaded in the leveling base to allow for adjusting the height of the leveling base and locking for the level of the base. Or other height-adjustable implements may be used, e.g., shims, wedges, hydraulic feet, ratchets, or interchangeable feet of different sizes. In some embodiments, each extending arm may include at least one adjustable leveling foot. In some cases, the leveling base may include a plurality of height-adjustable feet extending from the bottom of the base. In some cases, the height adjustable stands may be bolts threaded into a threaded interface of the base. The bolts extend downward to feet 576, the bolts being adjustable thereby adjusting the height of the feet. In some cases, before the racks are installed, the base may be leveled, so that the weight of the chamber does not interfere with leveling.

Figure 13:
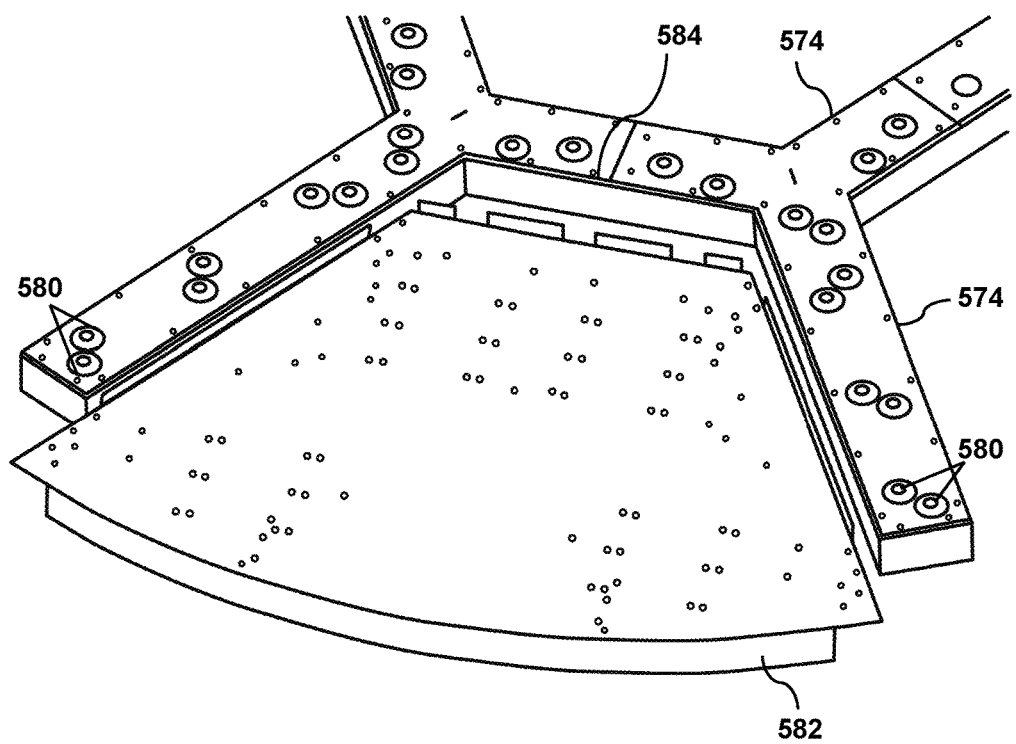
FIG. 13 is a view of a portion of the leveling base of FIG. 11, in accordance with some embodiments.

In some embodiments, as shown in FIG. 13, the upper side of the leveling base includes devices for reducing friction as a wedge-shaped rack is translated over the base. In this example, a plurality of ball bearings 580 located in the extending arms 574 and the center piece 572 of the leveling base 570. The ball bearings are configured to create a guide and support for the racks as they are lifted slightly and slide into place. In some embodiments, the ball bearings 580 include a steel ball seated in a socket. A portion of the ball may extend out of the socket and above the base, with the socket extending into the respective arm, so that less than half of the ball bearing extends above the top surface of the arm. In some cases, each ball bearing has a diameter of between one and three centimeters. In some embodiment, the socket may house a plurality of smaller bearings (e.g., between 2 and 5 millimeters) on which the exposed ball bearing rides to lower friction. Examples include an SP-30 ball transfer unit available from Ahcell of Taizhou, Jiangsu Province in China. In some embodiments, each extending arm may include eight ball bearings configured such that four ball bearings guide and support one bottom side of a rack and the other four ball bearings on the same arm are configured to guide and support one bottom side of an adjacent rack.

During installation of a wedge-rack, the wedge-rack may be translated (e.g., slid, rolled or carried) horizontally toward the interior chamber, between the respective arms receiving the unit. As the rack makes contact with the distal portion of the ball bearings extending upward from the arms, the bottom of the rack 582 may be lifted (in some cases by being slid against and up onto the ball bearings) and rolled on top of the ball bearing located on the arms located on each side of the bottom of the rack. Once on the ball bearing the bottom of the rack is pushed (with relatively little effort) such that the back side 584 of the bottom of the rack is on top of the ball bearing located on the center piece of the leveling base. As the rack is pushed backward a first force is generated translating the rack slightly upward, as the rack rolls onto the ball bearings. Then, as the rack rolls over the ball bearings, the rack may translate downward to sit on the leveling base, e.g., the bottom of the rack may include an indent to receive each ball bearings when in the proper position, thereby providing haptic feedback indicative of proper alignment.

Once in place, the bottom of the rack may be secured using an electronic latch, or a manual latch (e.g., a peg in a hole). In some embodiments, once the rack is in place a signal indicating that the rack is properly seated on the leveling arm may be generated (e.g., audible signal, visual signal, or other forms of signals). In some embodiments, a gasket sealer may be used to seal the racks side by side and to seal the back side of the rack to the chassis.

Alternatively or additionally, the leveling base may include air-casters configured to secure each of the racks to the leveling base. In some embodiments, air-casters may be created in the assembled leveling base such that they coincide with mating structures on the bottom side of the rack. The air-casters create a guide for the racks as they are lifted slightly and slid into place. Once in position, the rack is lowered onto the base and settles into the air-casters, which is expected to help with proper alignment. In some embodiments, other structures may reduce friction, e.g., Teflon™ bushings, bearings on the bottom of the rack, wheels on the top of the base or bottom of the rack, etc.

Figure 14:
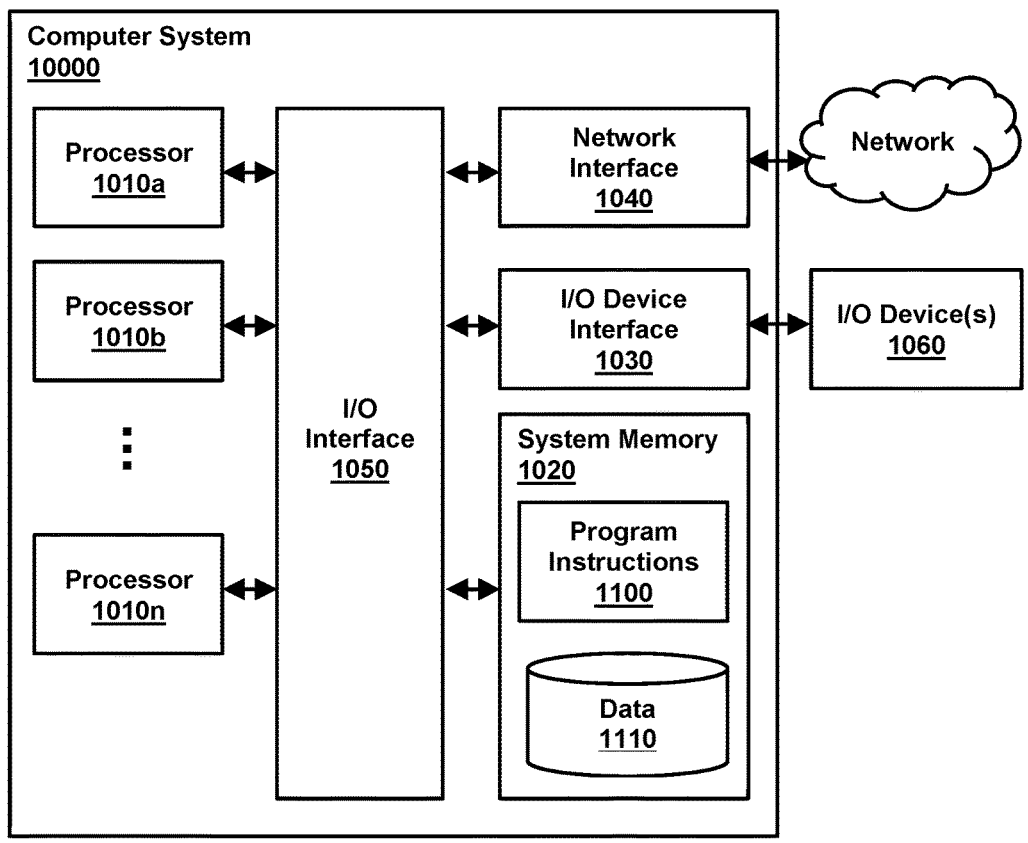
FIG. 14 illustrates components of a computing device that may be disposed and interconnected in the cylindrical datacenter chamber of FIG. 1.

FIG. 14 is a diagram that illustrates an exemplary computing system 1000 in accordance with embodiments of the present technique. In some cases, each U in each rack of the above-described chamber may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A datacenter chamber having racks configured to hold arrays of rack-mounted computing devices, the datacenter chamber comprising: three or more racks, each rack having a plurality of receptacles configured to hold a computing device; a chassis configured to secure each of the racks in spaced relation relative to one another, wherein the chassis is configured to secure the racks facing outward from an interior chamber defined by a back-side of the racks, and wherein the chassis is configured to position the racks facing at least three different directions; and an integrated cooling system configured to drive a cooling fluid along computing devices mounted in the racks and through the interior chamber.

2. The datacenter chamber of embodiment 1, wherein the integrated cooling system comprises a fan mounted in fluid communication with the interior chamber.

3. The datacenter chamber of any of embodiments 1-2, wherein the interior chamber defines an approximately hexagonal cylindrical shape and the integrated cooling system comprises a fan.

4. The datacenter chamber of any of embodiments 1-3, further comprising an exhaust vent configured to mount to an end of the interior chamber.

5. The datacenter chamber of any of embodiments 1-4, further comprising an integrated power infrastructure.

6. The datacenter chamber of any of embodiments 1-5, further comprising a plurality of direct current (DC) power bars extending generally parallel to the interior chamber and positioned to electrically couple to computing devices inserted into the receptacles during and as a result of insertion.

7. The datacenter chamber of any of embodiments 1-6, further comprising an integrated ventilation infrastructure.

8. The datacenter chamber of any of embodiments 1-7, further comprising an integrated compute fabric configured to connect the computing devices.

9. The datacenter chamber of any of embodiments 1-8, wherein at least some of the racks comprise front-side access, opposite the interior chamber, for compute, network, and storage interfaces for computing devices mounted in the racks.

10. The datacenter chamber of any of embodiments 1-9, further comprising: a tube defined by surrounding baffles, at least partially defining the interior chamber, and sized such that sides of the tube correspond to at least one of the racks.

11. The datacenter chamber of any of embodiments 1-10, wherein the chassis comprises bearings configured to at least partially support and rotate against at least one of the racks during installation of the respective rack.

12. The datacenter chamber of any of embodiments 1-11, wherein at least one of the racks is a wedge rack defining generally wedge-shaped volume along at least one side of the rack and configured to hold more than four computing devices.

13. The datacenter chamber of embodiment 12, wherein the wedge rack comprises: a first articulating panel configured to selectively provide access to a rack of computing devices: a second articulating panel configured to selectively provide access to a first wedge-shaped volume on one side of the rack of computing devices; and a third articulating panel configured to selectively provide access to a second wedge-shaped volume on a second side of the rack of computing devices.

14. The datacenter chamber of embodiment 13, comprising a plurality of rectifier modules disposed in the first wedge-shaped volume.

15. The datacenter chamber of any of embodiments 1-14, further comprising: a plurality of bus bars disposed along the racks adjacent the interior chamber; and a plurality of bus-bar braces coupled approximately perpendicular to the bus bars.

16. The datacenter chamber of any of embodiments 1-15, further comprising: a plurality of computing devices disposed in the racks, the computing devices having stored thereon operating systems and applications executing within the operating systems.

17. The datacenter chamber of any of embodiments 1-16, wherein the chassis comprises means for directing air to flow circumferentially inward or outward to cool rack-mounted computing equipment.

18. The datacenter chamber of any of embodiments 1-17, comprising: five or more wedge-shaped racks, each wedge-shaped rack being substantially identical to the other wedge-shaped racks, the five or more wedge shaped racks defining a cylinder having a base with five or more sides corresponding to the interior volume, and the five or more wedge shaped racks extending more than five feet along the length of the interior chamber, wherein: the chassis comprises a base comprising: means for leveling the base; means for reducing friction as a wedge-shaped rack is translated over the base; the integrated cooling system comprises means for forcing air to flow over computing equipment mounted in the wedge-shaped racks; and the chassis comprises means for distributing direct current (DC) power to at least some of the computing equipment.

19. A base for a server rack, the base comprising: a first arm extending in a first direction; a second arm extending in a second direction, different from the first direction, the first arm and second arm each having a bottom configured to face a floor and a top configured to face toward rack-mounted computing equipment; a plurality of height-adjustable stands extending from the bottom of the first arm and the second arm; and a plurality of ball-bearings extending from the top of the first arm and the second arm.

20. The base of embodiment 19, wherein the ball bearings are each seated in a respective socket having a plurality of smaller ball bearings.

21. The base of any of embodiments 19-20, wherein the height adjustable stands are bolts threaded into a threaded interface of the first or the second arm.

What is claimed is:

1. An apparatus configured to hold computing devices, the apparatus comprising:
   three or more racks, wherein:
      each rack is configured to hold a plurality of computing devices;
      each rack is oriented facing in a direction that is less than 90 degrees different from that of an adjacent one of the three or more racks; and
      the three or more racks define an interior volume enclosed at least in part by the three or more racks in a plane;
   a chassis comprising a leveling base extending under each of the three or more racks and configured to couple the three or more racks to one another and align the three or more racks with one another to define the interior volume, wherein the base comprises a plurality of arms extending under adjacent sides of the three or more racks; and
   cooling fluid restrictors configured to vary resistance to the flow of cooling fluid along a length of the interior volume, wherein:
      the cooling fluid restrictors are configured to impose more restriction to flow of the cooling fluid at one end of the three or more racks than at another end of the three or more racks;
      the cooling fluid restrictors are configured to prevent a downstream end of the interior volume from developing a pressure in the cooling fluid that causes cooling fluid that has been heated by flowing through at least some of the racks from flowing back into at least some of the racks and heating computing devices held by at least some of the racks.

2. The apparatus of claim 1, wherein:
the three or more racks are wedge racks;
each wedge rack is configured to hold more than 10 computing devices in a vertical array of computing devices;
the interior volume is fully enclosed by the three or more wedge racks and the cooling fluid restrictors in a horizontal plane;
the base is configured to couple the three or more wedge racks to one another at one end of the three or more wedge racks;
the chassis comprises a brace with three or more surfaces configured to receive the three or more wedge racks; and the three or more wedge racks, the base, the brace, and the cooling fluid restrictors are assembled into a chamber.

3. The apparatus of claim 1, wherein:
the interior volume tapers along a direction of flow of the cooling fluid through the interior volume.

4. The apparatus of claim 1, wherein:
the cooling fluid restrictors are configured to prevent positive static pressure from developing in a downstream end of the interior volume.

5. The apparatus of claim 1, wherein:
the interior volume extends in a vertical direction and the cooling fluid restrictors extend horizontally.

6. The apparatus of claim 1, wherein:
the cooling fluid restrictors comprise a plurality of orifices.

7. The apparatus of claim 1, wherein:
the cooling fluid restrictors comprise means for varying airflow restrictions vertically.

8. The apparatus of claim 1, wherein:
the cooling fluid restrictors are configured to vary cooling-fluid-flow restriction smoothly along the three or more racks.

9. The apparatus of claim 1, wherein:
the cooling fluid restrictors are disposed between the interior volume and the three or more racks.

10. The apparatus of claim 1, wherein:
the cooling fluid restrictors progressively increase in restriction to fluid flow from one end of the three or more racks to another end of the three or more racks; and
the three or more racks each comprise a plurality of power bus bars configured to deliver power to rack mounted computing devices via a blind mating connection to the rack mounted computing devices; and
the three or more racks comprise six or more racks and means for orienting the six or more racks into alignment.

11. The apparatus of claim 1, wherein:
the cooling fluid restrictors include a hexagonal lattice of holes.

12. The apparatus of claim 1, wherein:
the cooling fluid restrictors comprise a plate with holes of varying size through which cooling fluid flows.

13. The apparatus of claim 1, comprising:
more than 50 computing devices held by the three or more racks.

14. The apparatus of claim 1, wherein:
the chassis comprises the brace and the base;
the brace extends from the base along the interior volume;
the brace surrounds the interior volume in a horizontal plane; and
the fluid flow restrictors are formed, at least in part, by apertures in the brace.

15. An apparatus configured to hold computing devices, the apparatus comprising:
   three or more racks, wherein:
      each rack is configured to hold a plurality of computing devices;
      each rack is oriented facing in a direction that is less than 90 degrees different from that of an adjacent one of the three or more racks; and
      the three or more racks define an interior volume enclosed at least in part by the three or more racks;
   a chassis coupled to a base extending under each of the three or more racks and configured to couple the three or more racks to one another and align the three or more racks with one another to define the interior volume, wherein the base comprises a plurality of arms adjacent sides of the three or more racks; and cooling fluid restrictors configured to vary resistance to the flow of cooling fluid along a length of the three or more racks, wherein:

the cooling fluid restrictors are configured to impose more restriction to flow of the cooling fluid at one end of the three or more racks than at another end of the three or more racks;

the cooling fluid restrictors are configured to prevent a downstream end of the interior volume from developing a pressure in the cooling fluid that causes cooling fluid that has been heated by flowing through at least some of the racks from flowing back into at least some of the racks and heating computing devices held by at least some of the racks.

16. The apparatus of claim 15, wherein:

the base is a leveling base; and the arms extend under adjacent sides of the three or more racks.

17. The apparatus of claim 15, wherein:

the base is a modular and interlocking leveling base.

18. The apparatus of claim 15, wherein:

one of the racks comprises a first panel and a second panel;

the first panel is configured to selectively provide access to computing devices; and second panel is configured to selectively provide access to a wedge-shaped volume on one side of computing devices in the one of the racks.

19. The apparatus of claim 15, wherein one of the racks comprises:

a rack rear support;

a rack front support; and a plurality of bus bars.

20. The apparatus of claim 15, wherein one of the racks comprises:

a plurality of equipment trays, the trays having respective openings comprising power connectors.

21. The apparatus of claim 15, wherein one of the racks comprises:

remotely controllable uninterruptible power supply comprising a battery module.

22. The apparatus of claim 15, comprising:

a lid configured to fit on top of the three or more racks and house wiring and a top-of-rack network switch.

* * * * *